United States Patent
Guo et al.

(10) Patent No.: US 7,719,510 B2
(45) Date of Patent: May 18, 2010

(54) FLAT PANEL DISPLAY, DISPLAY DRIVING APPARATUS THEREOF AND SHIFT REGISTER THEREOF

(75) Inventors: Hong-Ru Guo, Tainan County (TW); Chien-Hsiang Huang, Tainan County (TW); Ming-Chun Tseng, Tainan County (TW)

(73) Assignees: Chi Mei El Corporation, Tainan County (TW); Chi Mei Optoelectronics Corporation, Tainan County (TW)

( * ) Notice: Subject to any disclaimer, the term of this patent is extended or adjusted under 35 U.S.C. 154(b) by 1048 days.

(21) Appl. No.: 11/429,072

(22) Filed: May 5, 2006

(65) Prior Publication Data
US 2007/0030239 A1    Feb. 8, 2007

(30) Foreign Application Priority Data
Aug. 2, 2005    (TW) .............................. 94126158 A

(51) Int. Cl.
*G09G 3/36* (2006.01)
(52) U.S. Cl. ..................................... 345/100; 345/204
(58) Field of Classification Search ................... 345/82, 345/100, 204, 208, 212, 213
See application file for complete search history.

(56) References Cited

U.S. PATENT DOCUMENTS

| | | | | |
|---|---|---|---|---|
| 5,956,011 A | * | 9/1999 | Koyama et al. | 345/98 |
| 6,373,458 B1 | * | 4/2002 | Yamakura et al. | 345/98 |
| 7,068,246 B2 | * | 6/2006 | Yamazaki et al. | 345/76 |
| 7,158,128 B2 | * | 1/2007 | Fujino et al. | 345/204 |
| 2004/0085284 A1 | * | 5/2004 | Chen et al. | 345/100 |

* cited by examiner

*Primary Examiner*—Kevin M Nguyen
*Assistant Examiner*—Kenneth B Lee, Jr.
(74) *Attorney, Agent, or Firm*—J.C. Patents

(57) ABSTRACT

A flat panel display, a display driving apparatus thereof and a shift register thereof are disclosed. The shift register is adapted for driving a flat panel display. The shift register receives an input signal and a clock signal. The shift register includes a delay unit and a buffer unit. The delay unit is used to delay the input signal for a half period of the clock signal and then output the delayed input signal. The buffer unit receives the delayed input signal, and provides an extra driving power accordingly. The buffer unit is operated by a fixed first voltage and a fixed second voltage.

19 Claims, 10 Drawing Sheets

FLAT PANEL DISPLAY, DISPLAY DRIVING APPARATUS THEREOF AND SHIFT REGISTER THEREOF

CROSS-REFERENCE TO RELATED APPLICATION

This application claims the priority benefit of Taiwan application serial no. 94126158, filed on Aug. 2, 2005. All disclosure of the Taiwan application is incorporated herein by reference.

BACKGROUND OF THE INVENTION

1. Field of Invention

The present invention relates to a shift register. More particularly, the present invention relates to a flat panel display, a display driving apparatus thereof and a shift register thereof.

2. Description of Related Art

As the flat panel display (for example, liquid crystal display (LCD)) has such characteristics as being light, thin, small, low radiation and power saving, these features help save the space usage of office or home, and reduce the feeling of eye tiredness after a long time viewing. Therefore, the flat panel display has characteristic to fully substitute the conventional cathode ray tube (CRT).

FIG. 1A is a circuit diagram of a conventional shift register, which is implemented upon a glass substrate using low temperature poly silicon (LTPS) technology. Referring to FIG. 1A, the shift register can be adapted for the driving circuit of the flat panel display, for example, the gate driver for vertical scan of the liquid crystal display. FIG. 1A includes 5 stages of same shift registers, SR1, SR2, SR3, SR4, and SR5, respectively. Each shift register includes an input terminal In, clock signal input terminals CKA and CKB and an output terminal Out. FIG. 1A includes four clock signal wires respectively inputting a first clock signal CK1, a second clock signal CK2, a third clock signal CK3 and a fourth clock signal CK4. In addition, FIG. 1A also includes a start pulse wire SP.

FIG. 1B is a detailed circuit diagram of the conventional shift register SR1 in FIG. 1A, which is implemented upon a glass substrate using the low temperature poly silicon (LTPS) technology. The circuit comprises thin film transistors (TFT) 101, 102, 103 and a capacitor 104. The first source/drain of the TFT 101 is the input terminal In of the SR1. The second source/drain of the TFT 101 is coupled to the gate of the TFT 102. The gate of the TFT 101 is the clock signal input terminal CKA, and the gate of the TFT 101 is coupled to the gate of the TFT 103. The first source/drain of the TFT 102 is the clock signal input terminal CKB. The second source/drain of the TFT 102 is the output terminal Out of the SR1. The first source/drain of the TFT 103 is coupled to the second source/drain of the TFT 102. The second source/drain of the TFT 103 is the low level voltage input terminal VSS.

FIG. 1C is a clock diagram of the circuit in FIG. 1A. Referring to FIG. 1A, FIG. 1B, and FIG. 1C simultaneously, we presume that the low level of the voltage amplitude of the clock signal equals to VSS, and the high level of the voltage amplitude of the clock signal equals to VDD, and VDD>VSS. First, a start pulse on the start pulse wire SP is provided to the input terminal In, and at this time, the clock signal CK1 is at high level voltage (VDD). Accordingly, the TFT 101 and the TFT 103 are conducted so that the high level voltage is stored in the capacitor 104. When the clock signal CK1 turns to low level from high level, the clock signal CK3 also turns to high level from low level at the same time. As the capacitor 104 stores the high level voltage, the gate of the TFT 102 receives the high level voltage so that the high level voltage VDD on the clock signal CK3 is conducted to the output terminal Out. Accordingly, the next shift register SR2 starts to receive the high level voltage output from the output terminal Out.

Although the conventional technology has provided an architecture of shift registers, however, the architecture has one disadvantage. Referring to FIG. 1B, it can be learned from FIG. 1B that the clock signal CKB must be input from the source/drain of the TFT 102. Accordingly, the clock signal generator should have very strong driving power; however, the increase of the driving power would cause the increase of the layout area.

SUMMARY OF THE INVENTION

Accordingly, the present invention is directed to provide a shift register, used to reduce the required driving power of the chip in providing the clock signal.

Another aspect of the present invention is to provide a display driving apparatus, used to reduce the layout area of the chip.

Another aspect of the present invention is to provide a flat panel display to reduce the cost.

The present invention provides a shift register, adapted for driving a flat panel display. The shift register receives an input signal and a clock signal. The shift register includes a delay unit and a buffer unit. The delay unit is used to delay the input signal for half period of the clock signal and then output the delayed input signal. The buffer unit receives the output signal of the delay unit, and provides an extra driving power accordingly. Wherein, the buffer unit is operated by a fixed first voltage and a fixed second voltage.

According to a shift register described in one preferred embodiment of the present invention, the delay unit comprises a first switching unit, a charge storing unit and a second switching unit. The first switching unit comprises a first end and a second end, wherein the first end is the input terminal of the delay unit. According to the clock signal, it is determined whether to conduct the circuit between the first end and the second end. One end of the charge storing unit is coupled to the first voltage, and the other end is coupled to the second end. The second switching unit comprises a third end and a fourth end, wherein the third end is coupled to the second end, and the fourth end is the output terminal of the delay unit. According to the reversed signal of the clock signal, it is determined whether to conduct the circuit between the third end and the fourth end.

According to a shift register described in one preferred embodiment of the present invention, the buffer unit comprises a third switching unit and a fourth switching unit. The third switching unit comprises a first control terminal, a fifth end and a sixth end, wherein the first control terminal is coupled to the fourth end, and the fifth end is coupled to the second voltage. The fourth switching unit comprises a second control terminal, a seventh end and an eighth end, wherein the second control terminal is coupled to the clock signal, and the seventh end is coupled to the sixth end, and the eighth end is coupled to the first voltage.

The present invention further provides a display driving apparatus comprising N shift registers, and each shift register comprises an input node, an output node, a delay unit and a buffer unit. An input terminal of the delay unit is coupled to the input node, and the delay unit is used to delay a signal on the input node for half period or the clock signal and then output the delayed signal. An output terminal of the buffer unit is coupled to the output node, and the buffer unit is used to receive an output signal of the delay unit, and provide an extra driving power accordingly. Wherein, N is a nature integer, and the input node of the Nth shift register is coupled to the output node of the N−1th shift register. In addition, the buffer unit is operated by a fixed first voltage and a fixed second voltage.

The present invention further provides a flat panel display, comprising a display driving apparatus and a display panel. The display driving apparatus comprises N shift registers, and each shift register has an input node, an output node, a delay unit and a buffer unit. An input terminal of the delay unit is coupled to the input node, and the delay unit is used to delay a signal on the input node for half period of the clock signal and then output the delayed signal. An output terminal of the buffer unit is coupled to the output node, and the buffer unit is used to receive an output signal of the delay unit and provide an extra driving power accordingly. Wherein, N is a nature integer, and the input node of the Nth shift register is coupled to the output node of the N−1th shift register. In addition, the buffer unit is operated by a fixed first voltage and a fixed second voltage. The display panel receives data for the signals on the output nodes of the display driving apparatus for displaying image.

In the present invention, as the delay unit applies a fixed voltage supply and the clock signal is only needed to be provided to the gate of the transistor, the load for the clock signal is small. Therefore, the clock signal does not need too much driving power to operate the shift register normally, so that the volume of the clock generator can be reduced, therefore, the layout area of the clock generator and the cost can be reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2A:
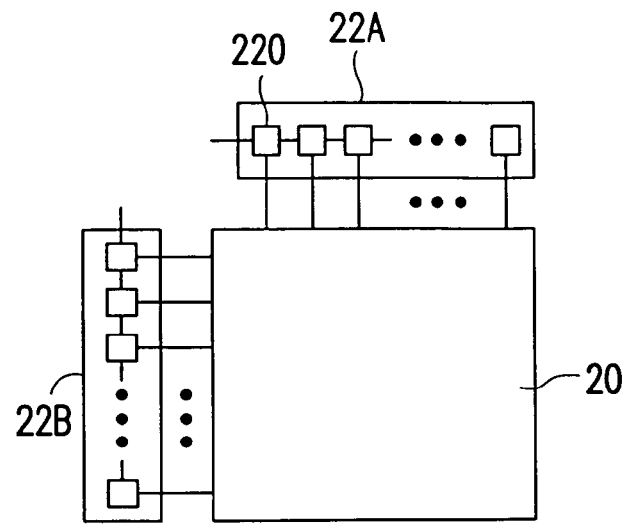
FIG. 2A is a block diagram of the flat panel display circuit according to one embodiment of the present invention.
Figure 2B:
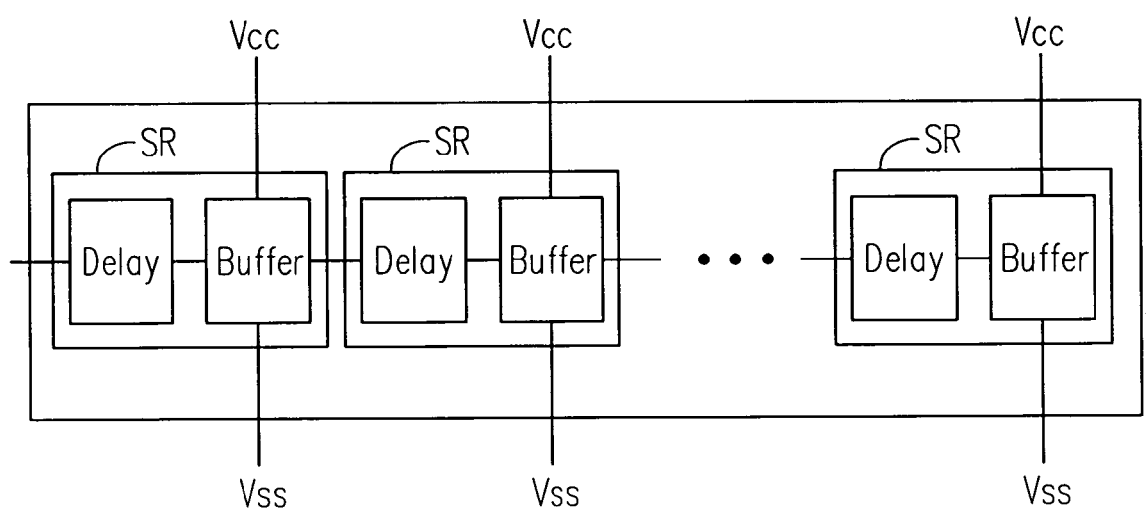
FIG. 2B is a diagram of the display driving apparatus according to one embodiment of the present invention.

The present invention provides a flat panel display, as shown in FIG. 2A, and the flat panel display comprises a display panel 20 and display driving apparatuses 22A and 22B. There are many shift registers SR in the display driving apparatuses 22A or 22B. The display driving apparatuses 22A and 22B are coupled to the substrate of display panel 20, used for driving the panel to display image. The detailed circuit of the display driving apparatus 22A is shown in FIG. 2B. The driving apparatus comprises a plurality of shift registers SR, and each shift register SR also comprises a delay unit Delay and a buffer unit Buffer. Wherein, the detailed circuit of the shift register SR is shown in FIG. 2C.

Figure 2C:
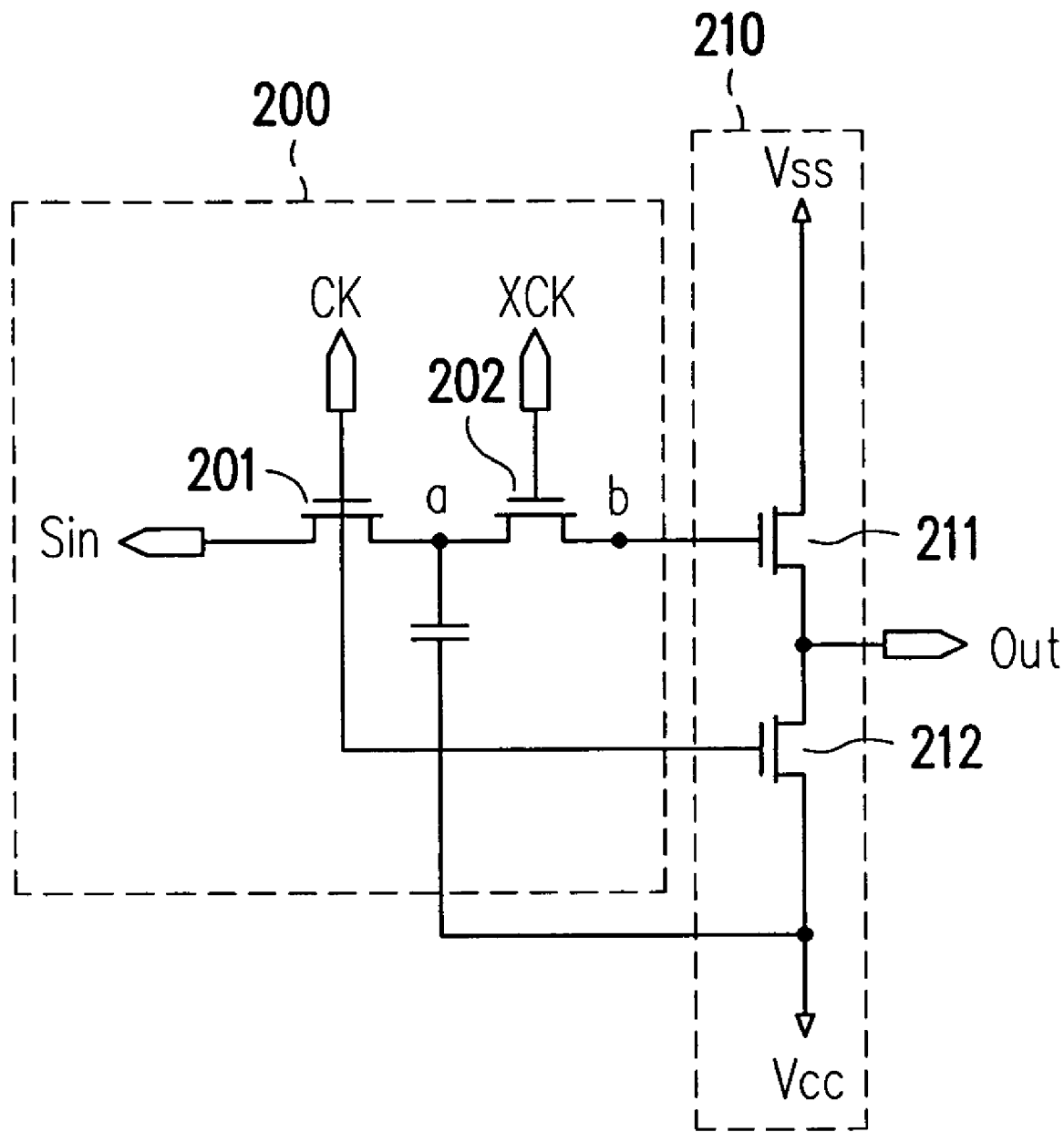
FIG. 2C is a circuit diagram of the shift register according to one embodiment of the present invention.

Referring to the shift register of the present invention as shown in FIG. 2C, the circuit can be divided into two portions: the first portion is a delay unit 200, and the second portion is a buffer unit 210. There are several nodes marked in the figure, they are Sin, CK, XCK, a, b, Vcc and Vss, respectively. Wherein, Sin is an input node, CK and XCK are clock signals reversed to each other, and the high level voltage Vcc and the low level voltage Vss are fixed voltage source. The function of the delay unit 200 is to delay the input signal on the input node Sin for a half period of the clock signal and then output the delayed input signal. The buffer unit 210 receives the output signal of the delay unit 200, i.e., the signal of the node b, and provides an extra driving power on the output node Out in accordance to the received output signal.

Figure 1A:
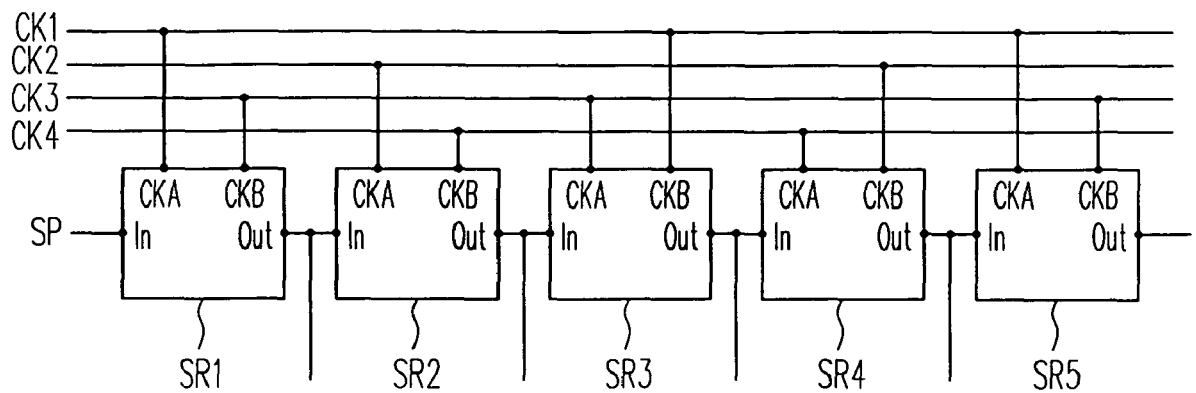
FIG. 1A is a circuit diagram of a conventional shift register, which is implemented upon a glass substrate using low temperature poly silicon (LTPS) technology.
Figure 1B:
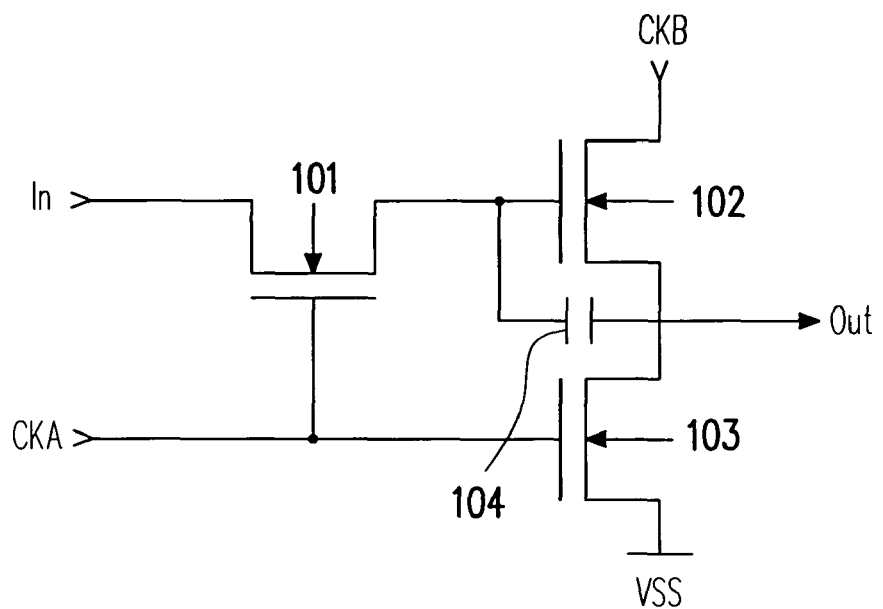
FIG. 1B is a detailed circuit diagram of the conventional shift register SR1 in FIG. 1A.
Figure 1C:
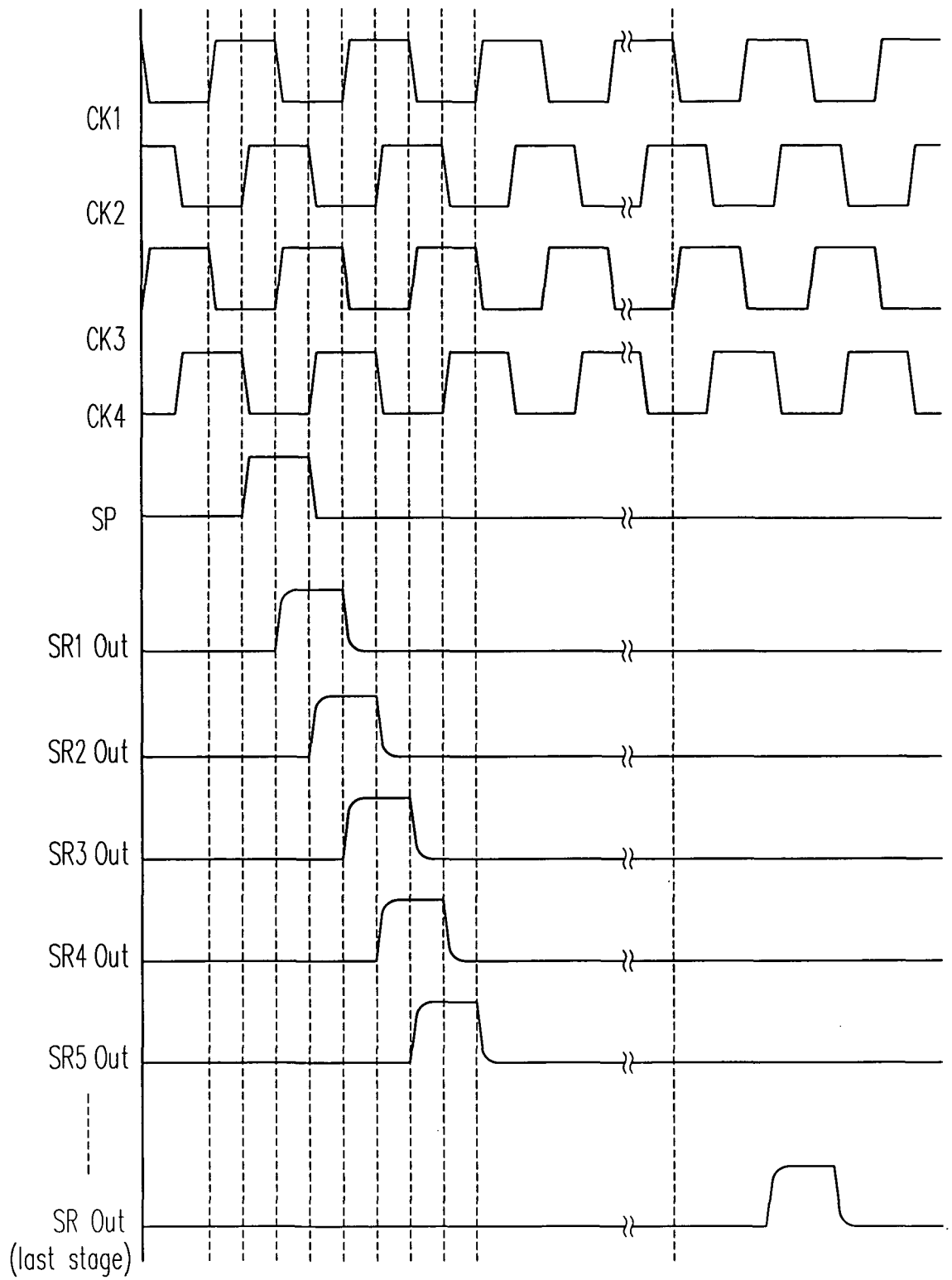
FIG. 1C is an operation waveform of the conventional circuit in FIG. 1A.

Referring to the transistors 102 and 103 in FIG. 1B and the buffer unit 210 in FIG. 2C simultaneously, it needs to be noticed that the buffer unit 210 is operated by fixed voltages Vcc and Vss. However, in the conventional shift register of FIG. 1B, the clock signal CKB is applied on the source/drain gate of the transistor 102. In addition, the shift register provided by the present invention uses four transistors in total: the delay unit 200 uses two transistors 201, 202 and a charge storing unit Cap (capacitor) to simple and hold; and the buffer unit 210 uses two transistors 211 and 212 to output the extra driving power.

Figure 3A:
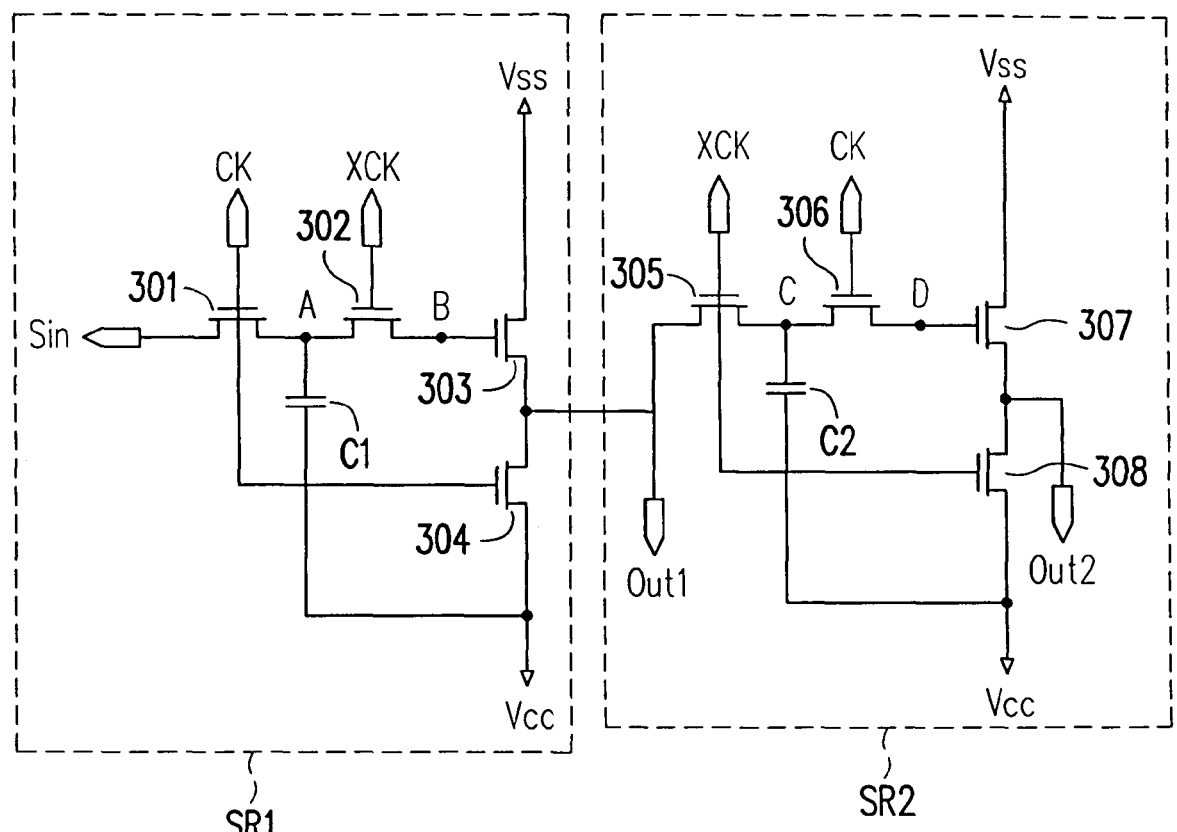
FIG. 3A is a circuit diagram of the shift register according to one embodiment of the present invention.
Figure 3B:
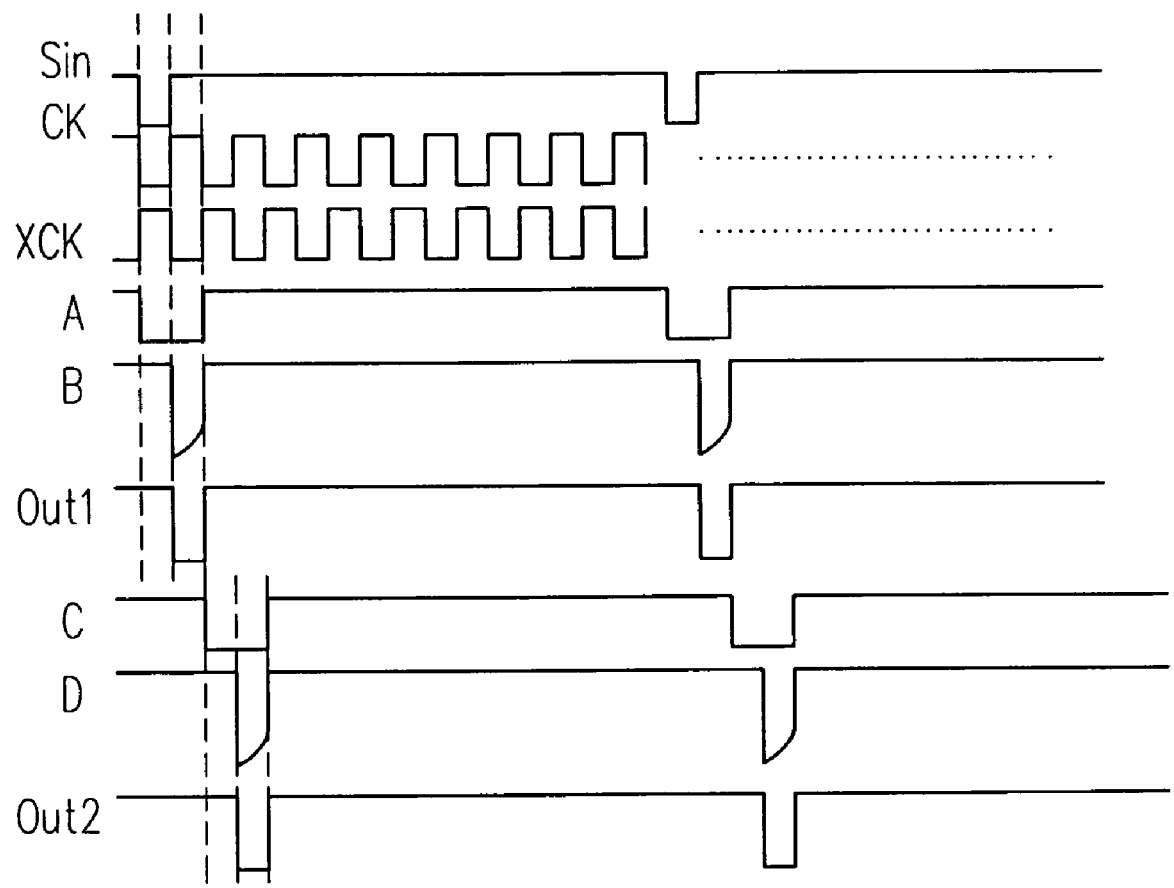
FIG. 3B is an operation waveform of the shift register circuit in FIG. 3A according to one embodiment of the present invention.

For convenience of description, please refer to FIG. 3A and FIG. 3B, the operation waveform, simultaneously. The single shift register architecture in FIG. 2C is revised to two shift registers of FIG. 2B, SR1 and SR2, as shown in FIG. 3A. FIG. 3A includes eight P type transistors, 301, 302, 303, 304, 305, 306, 307, and 308. Moreover, FIG. 3A also includes two capacitors, C1 and C2. In addition, for convenience of description, several nodes are marked in FIG. 3A, i.e., the input node Sin, node A, node B, node C, node D, output nodes Out1 and Out2. The clock signal CK and XCK are respectively added on the delay unit of each shift registers SR1, SR2. In addition, the high level voltage Vcc and the low level voltage Vss are respectively fixed voltage sources.

First, when the input node Sin begins to turn to low level voltage from high level voltage, the clock signal CK also begins to turn to low level voltage from high level voltage, and the clock signal XCK begins to turn to high level voltage from low level voltage. At this time, the gate of the transistor 301 receives a low level voltage and the transistor 301 begins to be conducted, and the gate of the transistor 302 receives a high level voltage so that the transistor 302 is turned off. The capacitor C1 is discharged into low level voltage through the transistor 301. The gate of the transistor 304 in the buffer unit also receives the low level voltage of the clock signal CK so that the transistor 304 is conducted. Accordingly, the output node Out1 maintains at high level voltage.

When the clock signal CK begins to turn to high level voltage from low level voltage, the other clock signal XCK also begins to turn to low level voltage from high level voltage. At this time, the transistor 301 is turned off, and the transistor 302 is conducted, and the high level voltage at the node B begins to be discharge through the capacitor at the node A, so that the gate of the transistor 303 receives a low level voltage, and at this time, the transistor 303 begins to be conducted. As the clock signal CK is at high level voltage at this time so as to turn off the transistor 304, the data (low level voltage) stored at the node A is output to the output node Out1 through the transistors 303 and 304 of the buffer unit.

Similarly, when the XCK is at low level voltage and received by the gate of the transistor 305, the transistor 305 begins to be conducted, and the output node begins to be discharged through the capacitor C2 at the node C. At this time, the capacitor C2 stores the data (low level voltage) output from the shift register SR1, and the gate of the transistor 306 is at high level voltage when coupled to the clock signal CK, so that the transistor 306 is turned off. At this time, the data (low level voltage) is held in the capacitor C2. The gate of the transistor 308 in the buffer unit also receives the low level voltage of the clock signal XCK so that the transistor 308 is conducted and the output node Out2 is maintained at high level voltage.

When the clock signal XCK begins to turn to high level voltage form low level voltage, the other clock signal CK also begins to turn to low level voltage from high level voltage. At this time, the transistor 305 is turned off, and the transistor 306 is conducted, and the high level voltage at the node D begins to be discharged through the capacitor at the node C, so that the gate of the transistor 307 receives a low level voltage, and at this time, the transistor 307 begins to be conducted. As the clock signal XCK is at high level voltage at this time so as to turn off the transistor 308, the data (low level voltage) stored at the node C is output to the output node Out2 through the transistors 307 and 308 of the buffer unit. Therefore, the data (low level voltage) can be transferred stage by stage by repeating the above operations.

Figure 4:
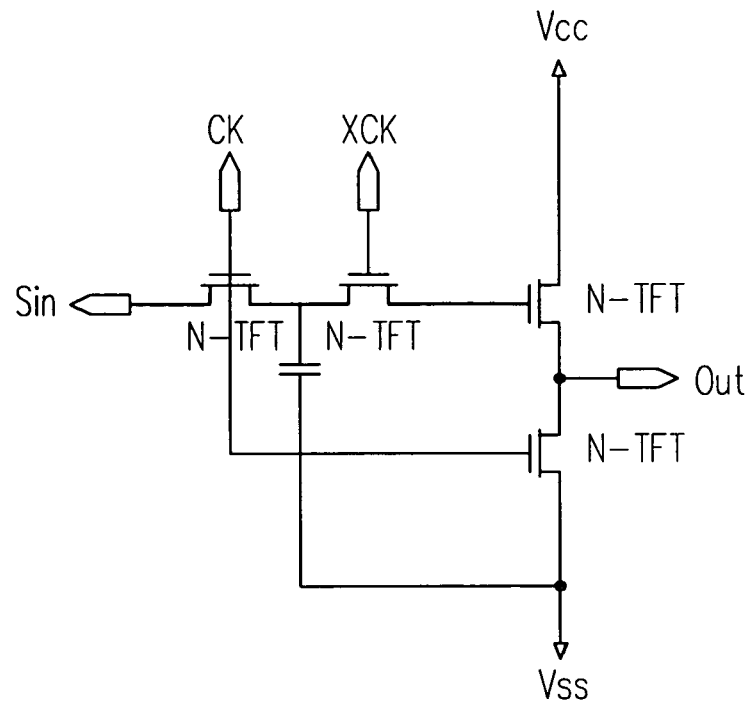
FIG. 4 is a circuit diagram of the shift register according to one embodiment of the present invention.
Figure 5:
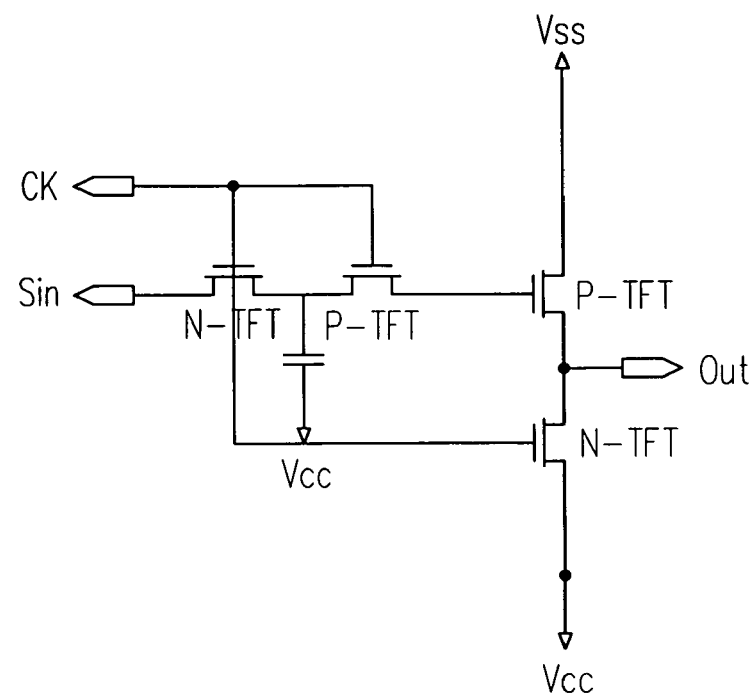
FIG. 5 is a circuit diagram of the shift register according to one embodiment of the present invention.
Figure 6:
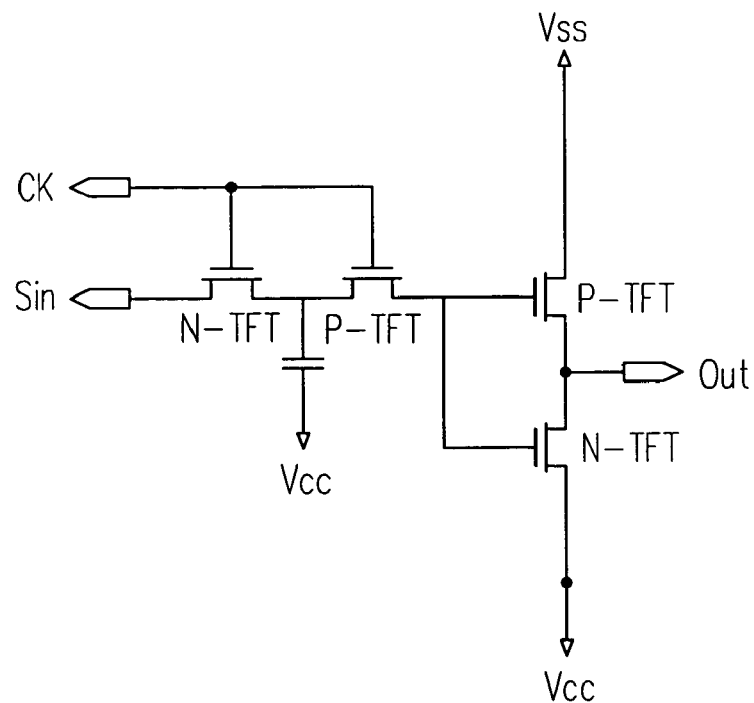
FIG. 6 is a circuit diagram of the shift register according to one embodiment of the present invention.

The above embodiment is just an example, and there are still many embodiments. For example, according to the embodiment as shown in FIG. 4, all of the transistors are changed to N type transistors, and the original low level voltage Vss and high level voltage Vcc are replaced by each other, and the operation modes thereof are almost the same, and readers can deduce them by themselves. The present invention can still applies the embodiment of CMOS, as shown in FIG. 5 and FIG. 6, and the operation modes are almost the same, and readers can deduce them by themselves.

Figure 7:
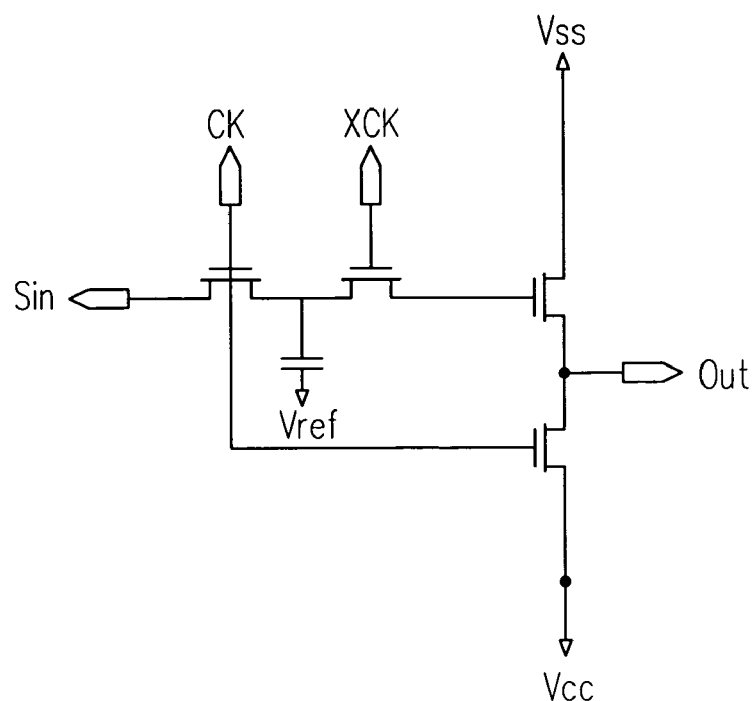
FIG. 7 is a circuit diagram of the shift register according to one embodiment of the present invention.
Figure 8:
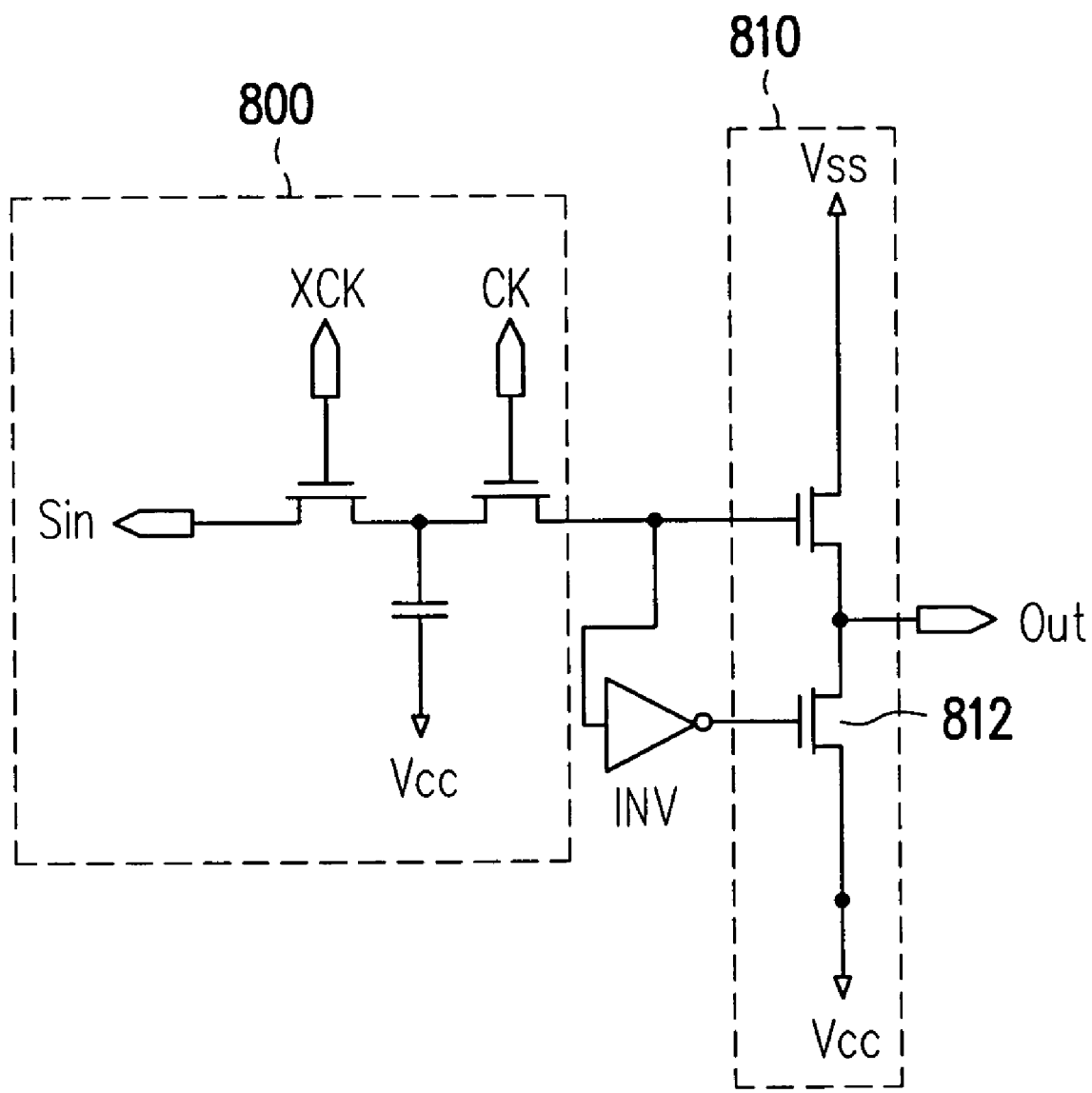
FIG. 8 is a circuit diagram of the shift register according to one embodiment of the present invention.

Wherein, the embodiment in FIG. 2B can still be changed to the embodiment as shown in FIG. 7. The capacitor in FIG. 7, originally coupled to Vcc, is changed to be coupled to a reference voltage Vref, and the operation theory is the same, so that the detail is omitted here. FIG. 8 describes another implementation mode of the embodiment of the present invention. The difference between FIG. 8 and FIG. 2B is that the gate of the transistor 212 of the buffer unit 210 in FIG. 2B is coupled to the clock signal CK, the gate of the transistor 812 of the buffer unit 810 in FIG. 8 is coupled to the output of an inverter INV, and the input of the inverter INV is coupled to the output of the delay unit 800; the operation is similar to that in FIG. 2B, so that the detail is omitted here.

Figures 9A, 9B:
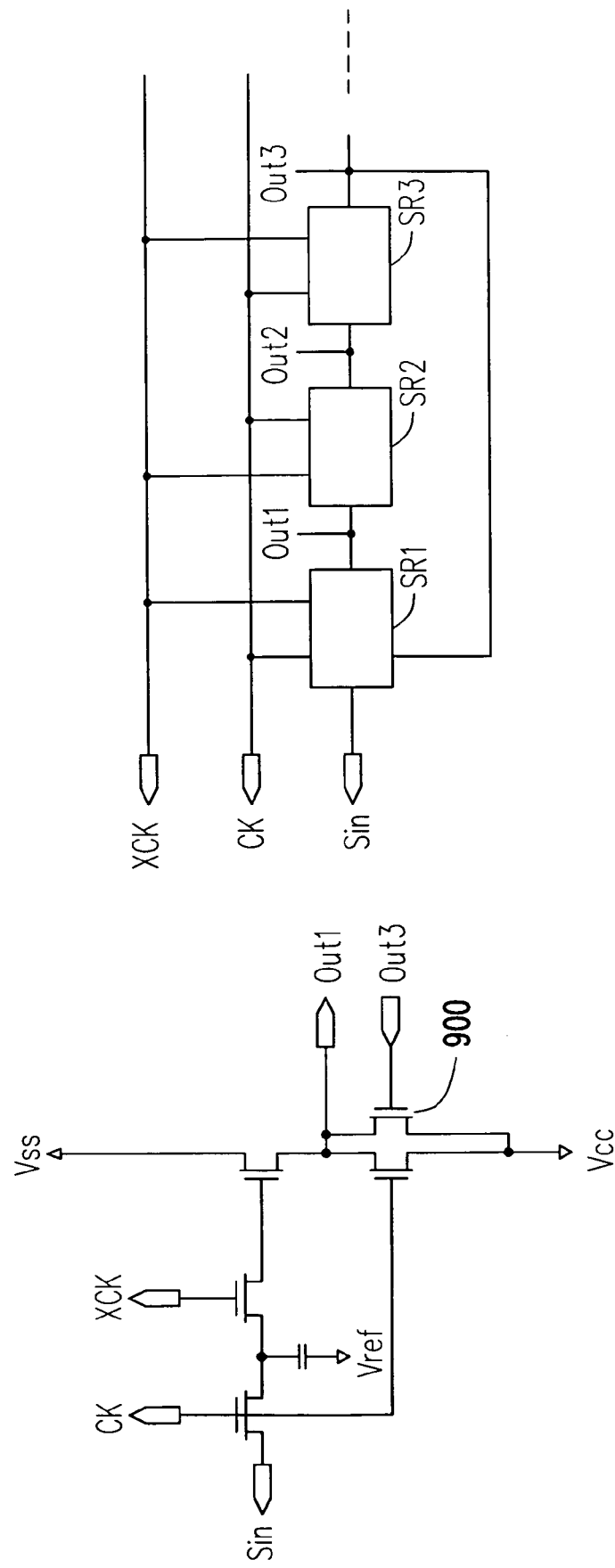
FIG. 9A is a circuit diagram of the shift register according to one embodiment of the present invention.
FIG. 9B is a circuit diagram of the shift register according to one embodiment of the present invention.

Moreover, FIG. 9A and FIG. 9B describe an implementation of the embodiment of the present invention. The difference between FIG. 9A and FIG. 7 is that there is one more switching unit 900 in FIG. 9A than FIG. 7. The circuit in the embodiment in FIG. 9A, implemented in FIG. 9B, is, for example, SR1. The output of SR1 is Out1, the next stage of the shift register SR1 is the shift register SR2 and output thereof is Out2, and the further next stage output is Out3. When a plurality of the circuits in FIG. 9A is connected serially as shown in FIG. 9B, the control terminal of the control switching unit 900 must be coupled to the output Out3. The implementation of the embodiment further provides more stable output voltage. As known by those with ordinary skill, FIG. 8A, FIGS. 9A, and 9B can be implemented by N-type or P-type transistors, or by the CMOS transistors. The detail is not further described here.

In summary, as the delay unit applies fixed voltage Source in the present invention and all of the clock signals are driving gates, the load effect output from the clock signal can be reduced. Besides, the layout area is reduced to lower the cost, and the change of the clock signal voltage will not affect the output terminal so that the voltage vibration of the output terminal is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A shift register, adapted for driving a flat panel display, where the shift register receives an input signal and a clock signal, the shift register comprising:
    a delay unit, comprising an input terminal and an output terminal, and the delay unit being used to delay the input signal for a half period of the clock signal and then output the delayed input signal; and
    a buffer unit, receiving an output signal of the delay unit and providing an extra driving power in accordance with the received output signal,
    wherein, the buffer unit is operated by a fixed first voltage and a fixed second voltage; and
    wherein the delay unit comprises:
        a first switching unit, comprising a first end and a second end, wherein the first end is the input terminal of the delay unit, and the first switching unit determines whether to conduct the circuit between the first end and the second end according to the clock signal;
        a charge storing unit, one end of the charge storing unit being coupled to a third voltage, and another end being coupled to the second end; and
        a second switching unit, comprising a third end and a fourth end, wherein the third end is coupled to the second end, the fourth end is the output terminal of the delay unit, and the second switching unit determines whether to conduct the circuit between the third end and the fourth end according to the clock signal.

2. The shift register as claimed in claim 1, wherein the buffer unit comprises: a third switching unit, comprising a first control terminal, a fifth end and a sixth end, wherein the first control terminal is coupled to the fourth end, and the fifth end is coupled to the second voltage; and a fourth switching unit, comprising a second control terminal, a seventh end and a eighth end, wherein the second control terminal is coupled to the clock signal, the seventh end is coupled to the sixth end, and the eighth end is coupled to the first voltage.

3. The shift register as claimed in claim 1, wherein the buffer unit comprises: a third switching unit comprising a first control terminal a fifth end and a sixth end, wherein the first control terminal is coupled to the fourth end, and the fifth end is coupled to the second voltage; an inverter, an input terminal of the inverter being coupled to the fourth end; and a fourth switching unit, comprising a second control terminal, a seventh end and an eighth end, wherein the second control terminal is coupled to an output terminal of the inverter, the seventh end is coupled to the sixth end, and the eighth end is coupled to the first voltage.

4. The shift register as claimed in claim 2, wherein the buffer unit further comprises: a fifth switching unit, comprising a ninth end, a tenth end, wherein the ninth end is coupled to the sixth end, and the tenth end is coupled to the first voltage.

5. The shift register as claimed in claim 4, wherein when multiple shift registers are connected in series, the fifth switching unit further comprises a third control terminal, and the third control terminal is coupled to the output of the buffer unit of a next shift register connected after and next to the shift register.

6. The shift register as claimed in claim 2, wherein the third switching unit is one of a P type transistor and an N type transistor, wherein the gate is the first control terminal, the first source/drain is the fifth end, and the second source/drain is the sixth end.

7. The shift register as claimed in claim 2, wherein the fourth switching unit is one of a P type transistor and an N type transistor, wherein the gate is the second control terminal, the first source/drain is the seventh end, and the second source/drain is the eighth end.

8. The shift register as claimed in claim 3, wherein the third switching unit is one of a P type transistor and an N type transistor, wherein the gate is the first control terminal, the first source/drain is the fifth end, and the second source/drain is the sixth end.

9. The shift register as claimed in claim 3, wherein the fourth switching unit is one of a P type transistor and an N type transistor, wherein the gate is the second control terminal, and the first source/drain is the seventh end, and the second source/drain is the eighth end.

10. The shift register as claimed in claim 1, wherein the first switching unit is one of a P type transistor and an N type transistor, wherein the gate receives the clock signal, the first source/drain is the first end, and the second source/drain is the second end.

11. The shift register as claimed in claim 1, wherein the second switching unit is one of a P type transistor and an N type transistor, wherein the gate receives the reversed signal of the clock signal, the first source/drain is the third end, and the second source/drain is the fourth end.

12. The shift register as claimed in claim 1, wherein the change storing unit is a capacitor, and the third voltage equals to the first voltage.

13. A display driving apparatus, comprising: N number of shift registers, and each of the shift registers comprising: an input node; an output node; a delay unit, wherein an input terminal of the delay unit is coupled to the input node, and the delay unit is used to delay a signal on the input node for a half period of the clock signal, and then output the delayed signal; and a buffer unit, wherein an output terminal of the buffer unit is coupled to the output node, and the buffer unit is used to receive an output signal of the delay unit and provide an extra driving power in accordance to the output signal, wherein, N is a nature integer, and the input node of the Nth shift register is coupled to the output node of the N−1th shift register; and the buffer unit is operated by a fixed first voltage and a fixed second voltage;

wherein the delay unit comprises: a first switching unit, comprising a first end and a second end, wherein the first end is the input terminal of the delay unit, and the first switching unit determines whether to conduct the circuit between the first end and the second end according to the clock signal; a charge storing unit, one end of the charge storing unit being coupled to a third voltage, and another end of the charge storing unit being coupled to the second end; and a second switching unit, comprising, a third end and a fourth end, wherein the third end is coupled to the second end, the fourth end is the output terminal of the delay unit, and the second switching unit determines whether to conduct the circuit between the third end and the fourth end according to the clock signal.

14. The display driving apparatus as claimed in claim 13, wherein the buffer unit comprises: a third switching unit, comprising a first control terminal, a fifth end and a sixth end, wherein the first control terminal is coupled to the fourth end, and the fifth end is coupled to the second voltage; and a fourth switching unit, comprising a second control terminal, a seventh end and an eighth end, wherein the second control terminal is coupled to the clock signal, the seventh end is coupled to the sixth end, and the eighth end is coupled to the first voltage.

15. The display driving apparatus as claimed in claim 13, wherein the buffer unit comprises: a third switching unit, comprising a first control terminal, a fifth end and a sixth end, wherein the first control terminal is coupled to the fourth end, and the fifth end is coupled to the second voltage; an inverter, an input terminal of the inverter being coupled to the fourth end; and a fourth switching unit, comprising a second control terminal, a seventh end and an eighth end, wherein the second control terminal is coupled to an output terminal of the inverter, the seventh end is coupled to the sixth end, and the eighth end is coupled to the first voltage.

16. The display driving apparatus as claimed in claim 13, wherein the charge storing unit is a capacitor, and the third voltage equals to the first voltage.

17. A flat panel display, comprising: a display driving apparatus, comprising N number of shift registers, and each of the shift registers comprising: an input node; an output node; a delay unit, an input terminal of the delay unit being coupled to the input node, and the delay unit used to delay a signal on the input node for a half period of the clock signal and then output the delayed signal; and a buffer unit, an output terminal of the buffer unit being coupled to the output node, and the buffer unit used to receive an output signal of the delay unit and provide an extra driving power in accordance with the output signal, wherein, N is a nature integer, and the input node of the Nth shift register is coupled to the output node of the N−1th shift register; in addition, the buffer unit is operated by a fixed first voltage and a fixed second voltage; and a display panel, receiving data for the signals on the output nodes of the display driving apparatus for displaying image;

wherein the delay unit comprises: a first switching unit, comprising a first end and a second end, wherein the first end is the input terminal of the delay unit, and the first switching unit determines whether to conduct the circuit between the first end and the second end according to the clock signal; a charge storing unit, one end of the charge storing unit being coupled to the first voltage, and another end being coupled to the second end; and a second switching unit, comprising a third end and a fourth end, wherein the third end is coupled to the second end, the fourth end is the output terminal of the delay unit, and the second switching unit determines whether to conduct the circuit between the third end and the fourth end according to the clock signal.

18. The flat panel display as claimed in claim 17, wherein the buffer unit comprises: a third switching unit, comprising a first control terminal, a fifth end and a sixth end, wherein the first control terminal is coupled to the fourth end, and the fifth end is coupled to the second voltage; and a fourth switching unit, comprising a second control terminal, a seventh end and an eighth end, wherein the second control terminal is coupled to the clock signal, the seventh end is coupled to the sixth end, and the eighth end is coupled to the first voltage.

19. The flat panel display as claimed in claim 17, wherein the buffer unit comprises: a third switching unit, comprising a first control terminal, a fifth end and a sixth end, wherein the first control terminal is coupled to the fourth end, and the fifth end is coupled to the second voltage; an inverter, an input terminal of the inverter being coupled to the fourth end; and fourth switching unit, comprising a second control terminal a seventh end and an eighth end, wherein the second control terminal is coupled to an output terminal of the inverter, the seventh end is coupled to the sixth end, and the eighth end is coupled to the first voltage.

* * * * *